(12) United States Patent
Zhang et al.

(10) Patent No.: US 11,264,431 B2
(45) Date of Patent: Mar. 1, 2022

(54) DISPLAY PANEL AND DISPLAY DEVICE HAVING REGULAR AND TRANSPARENT DISPLAY REGIONS

(71) Applicant: Wuhan Tianma Micro-Electronics Co., Ltd., Wuhan (CN)

(72) Inventors: Guofeng Zhang, Wuhan (CN); Junqiang Wang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/818,901

(22) Filed: Mar. 13, 2020

(65) Prior Publication Data

US 2021/0134889 A1 May 6, 2021

(30) Foreign Application Priority Data

Oct. 31, 2019 (CN) .......................... 201911055982.3

(51) Int. Cl.
*H01L 27/32* (2006.01)

(52) U.S. Cl.
CPC ........ *H01L 27/322* (2013.01); *H01L 27/3234* (2013.01); *H01L 27/3244* (2013.01); *H01L 27/3211* (2013.01); *H01L 27/3216* (2013.01); *H01L 27/3218* (2013.01)

(58) Field of Classification Search
CPC ............... H01L 27/322; H01L 27/3234; H01L 27/3244; H01L 27/3211; H01L 27/3216; H01L 27/3218
See application file for complete search history.

(56) References Cited

U.S. PATENT DOCUMENTS

| 8,629,955 | B2* | 1/2014 | Uehara | G02F 1/133606 |
| | | | | 349/64 |
| 9,312,312 | B1* | 4/2016 | Tsai | H01L 27/3216 |
| 10,043,433 | B2* | 8/2018 | Sun | G09G 3/3225 |
| 10,325,959 | B2* | 6/2019 | Wang | G09G 3/3648 |
| 2007/0222915 | A1* | 9/2007 | Niioka | G02F 1/133509 |
| | | | | 349/62 |
| 2017/0146863 | A1* | 5/2017 | Tang | G02F 1/133753 |
| 2018/0277040 | A1* | 9/2018 | Lee | H01L 27/3218 |
| 2019/0250315 | A1* | 8/2019 | Boriskin | G02B 27/56 |
| 2019/0319079 | A1* | 10/2019 | Xing | G09G 3/2074 |
| 2020/0357862 | A1* | 11/2020 | Wang | H01L 27/3218 |
| 2021/0065625 | A1* | 3/2021 | Wang | G09G 3/3266 |
| 2021/0143230 | A1* | 5/2021 | Wang | H01L 27/32 |

(Continued)

FOREIGN PATENT DOCUMENTS

| CN | 102054400 A | 5/2011 |
| CN | 106205386 A | 12/2016 |
| CN | 107783336 A | 3/2018 |

(Continued)

*Primary Examiner* — Ida M Soward
(74) *Attorney, Agent, or Firm* — Anova Law Group, PLLC

(57) ABSTRACT

A display panel includes a display region that includes a normal display region and a transparent display region. The normal display region and the transparent display region are connected. The transparent display region includes multiple transparent areas and multiple pixels. The transparent areas have the same shape. For two adjacent transparent areas, a shape of one transparent area has a different placement angle than a shape of another transparent area.

18 Claims, 23 Drawing Sheets

(56) References Cited

U.S. PATENT DOCUMENTS

2021/0217820 A1* 7/2021 Zhao .................. H01L 27/3218

FOREIGN PATENT DOCUMENTS

| CN | 109950288 A | | 6/2019 |
|----|-------------|---|--------|
| CN | 110047880 A | | 7/2019 |
| CN | 110098238 A | * | 8/2019 |
| CN | 110289298 A | | 9/2019 |

* cited by examiner

DISPLAY PANEL AND DISPLAY DEVICE HAVING REGULAR AND TRANSPARENT DISPLAY REGIONS

CROSS-REFERENCE TO RELATED APPLICATION

This application claims the priority to Chinese Application No. 201911055982.3, filed on Oct. 31, 2019, the entire content of which is incorporated herein by reference.

TECHNICAL FIELD

The present disclosure relates to the field of display technology and, more particularly, to a display panel and a display device.

BACKGROUND

With the rapid development of display technology, in addition to conventional functions such as information presentation, the requirements on the appearance of display devices are gradually increasing. A larger screen ratio is the future market trend. Therefore, a display device with an under-screen camera structure is favored by consumers.

In a display device with an under-screen camera structure, the camera is disposed under a display area of a display panel, and light may pass through the display area of the display panel to the camera, so that the camera can capture a picture. However, due to diffraction phenomenon, imaging quality of the camera is poor, and pictures taken by the camera are blurred.

SUMMARY

In accordance with the present disclosure, a display panel is provided. The display panel includes a display region that includes a regular display region and a transparent display region that is connected to the regular display region. The transparent display region includes multiple transparent areas and multiple pixels. The transparent areas have the same shape. For two adjacent transparent areas, a shape of one transparent area has a different placement angle than a shape of another transparent area.

Also in accordance with the present disclosure, a display device is provided and includes a display panel. The display panel includes a display region. The display region includes a regular display region and a transparent display region that is connected to the regular display region. The transparent display region includes multiple transparent areas and multiple pixels. The transparent areas have the same shape. For two adjacent transparent areas, a shape of one transparent area has a different placement angle than a shape of another transparent area.

DETAILED DESCRIPTION OF THE EMBODIMENTS

Technical solutions of the present disclosure will be described with reference to the drawings. It will be appreciated that the described embodiments are some rather than all of the embodiments of the present disclosure. Other embodiments conceived by those having ordinary skills in the art on the basis of the described embodiments without inventive efforts should fall within the scope of the present disclosure.

Unless otherwise defined, all the technical and scientific terms used herein have the same or similar meanings as generally understood by one of ordinary skill in the art. As described herein, the terms used in the specification of the present disclosure are intended to describe exemplary embodiments, instead of limiting the present disclosure. The term "and/or" used herein includes any suitable combination of one or more related items listed.

Exemplary embodiments will be described with reference to the accompanying drawings, in which the same numbers refer to the same or similar elements unless otherwise specified. Features in various embodiments may be combined, when there is no conflict.

Figure 1:
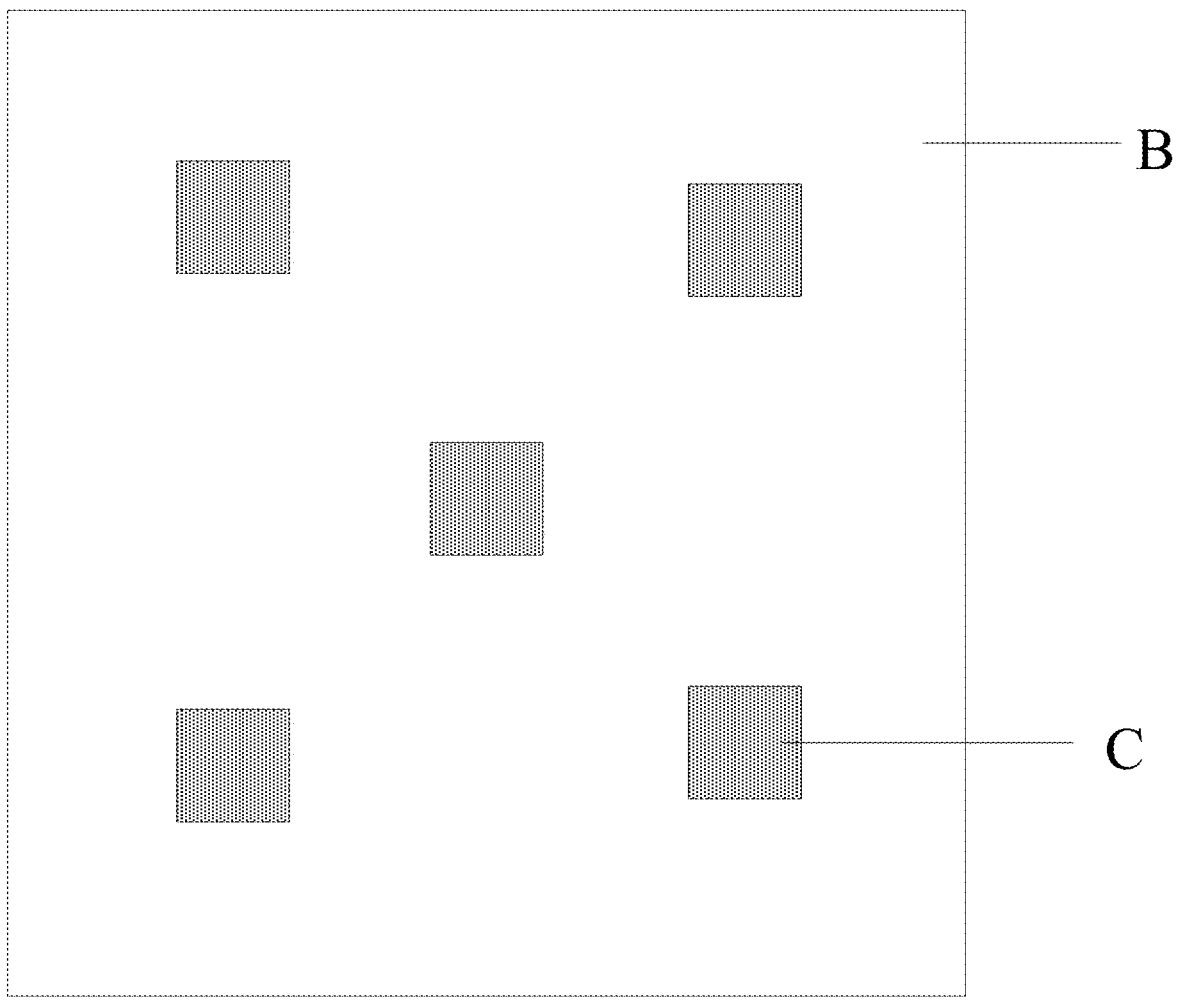
FIG. 1 illustrates a top view of display areas of a display device with an under-screen camera structure.
Figure 2:
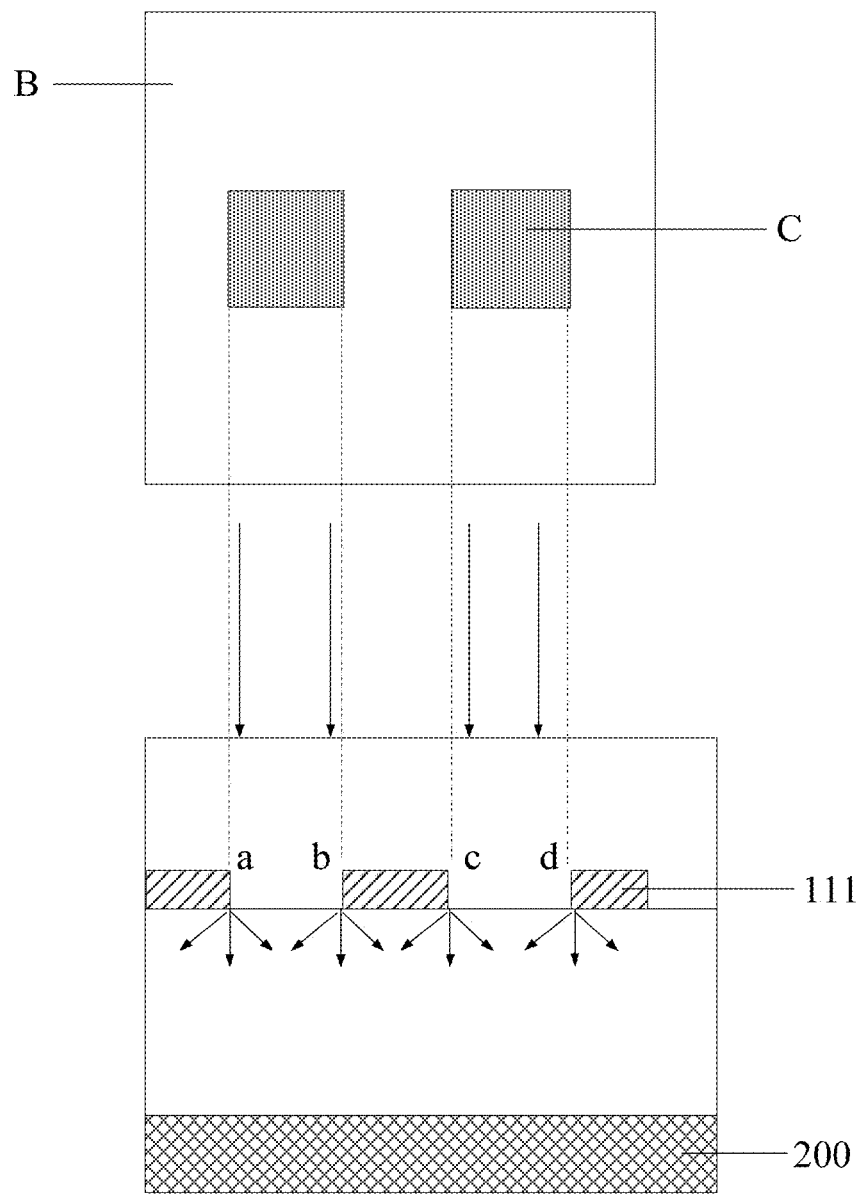
FIG. 2 is a diagram showing an imaging principle corresponding to the device of FIG. 1.

FIG. 1 shows a schematic layout of transparent areas of a display device with an under-screen camera structure. FIG. 2 shows a diagram illustrating an imaging principle corresponding to the layout of FIG. 1. As shown in FIG. 1, a transparent display area B of the display device includes multiple transparent areas C that are arranged in a regular layout pattern. FIG. 1 only displays a limited number of the transparent areas C. The upper half in FIG. 2 is a partial top view of the transparent display area B, and the lower half in FIG. 2 is a cross-sectional view corresponding to the top view.

As shown in FIG. 2, the light passes through the transparent display area B and propagates toward a camera 200. During the propagation process, the incident light (as shown by parallel downward arrows in FIG. 2) is diffracted at the edges a, b, c, and d of first electrodes 111. The diffracted light spreads as shown by the arrows at the edges a, b, c, and d and mixes to generate interference. The interference produces bright and dark fringes that are received by the camera 200.

Figure 3:
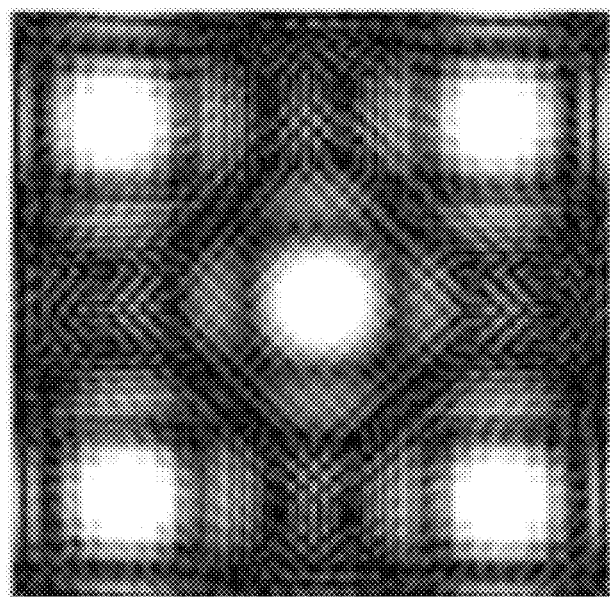
FIG. 3 is a diagram of brightness distribution after light passes through transparent display areas in the display device shown in FIG. 1.

FIG. 3 shows a diagram of brightness distribution after the diffracted light passes through the transparent display area B. Because the transparent areas C in the transparent display area B are arranged in certain order, the diffracted light creates bright and dark bands, i.e., bright and dark fringes as a result of constructive and destructive interference. For example, the five bright areas illustrated in FIG. 3 correspond to the five transparent areas C. There are four diffraction-enhanced bright bands around each bright area in FIG. 3. The diffraction-enhanced bands are caused by interference pattern of the diffracted light, which reduces the contrast between a central area and surrounding areas. Interference patterns of the diffracted light may also affect the central areas, and as such, the camera 200 may receive light information that is superimposed with interference patterns. Consequently, the imaging quality of the camera 200 may be reduced and pictures taken by the camera may be blurred.

Accordingly, in view of the imaging quality issues of the current display technology due to the diffraction phenomenon, embodiments of the present disclosure provide an improved display panel and display device.

Embodiments of the present disclosure will be described in detail with reference to the accompanying drawings. Dimensions of each film such as thickness and shape of each film in the drawings do not reflect the true ratios, and the purpose is only to illustrate the content of the present disclosure.

Figure 4:
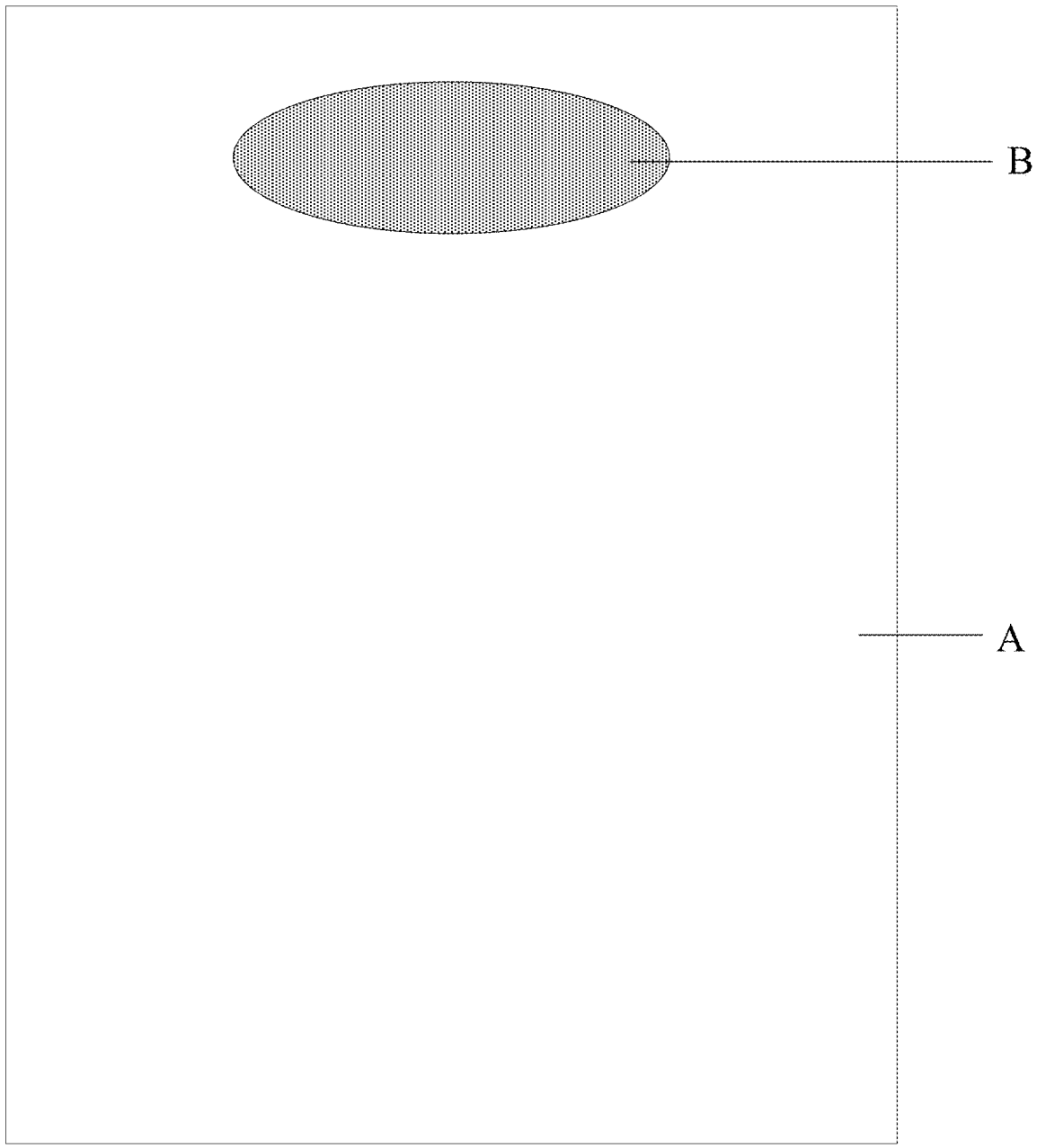
FIG. 4 illustrates a top view of an exemplary display panel according to various embodiments of the present disclosure.

FIG. 4 illustrates an exemplary layout of a display area of a display panel according to embodiments of the present disclosure. As shown in FIG. 4, the display area of the display panel includes a regular display area A and a transparent display area B. The regular display area A and the transparent display area B may be connected with each other in various ways. In some embodiments, as shown in FIG. 4, the transparent display area B may be disposed inside the regular display area A or surrounded by the regular display area A. In some other embodiments, the transparent display area B may be disposed outside the regular display area A. When the transparent display area B is outside the regular display area A, the transparent display area B may contact the regular display area A or may be spaced apart from the regular display area A by a predetermined distance.

Figure 5:
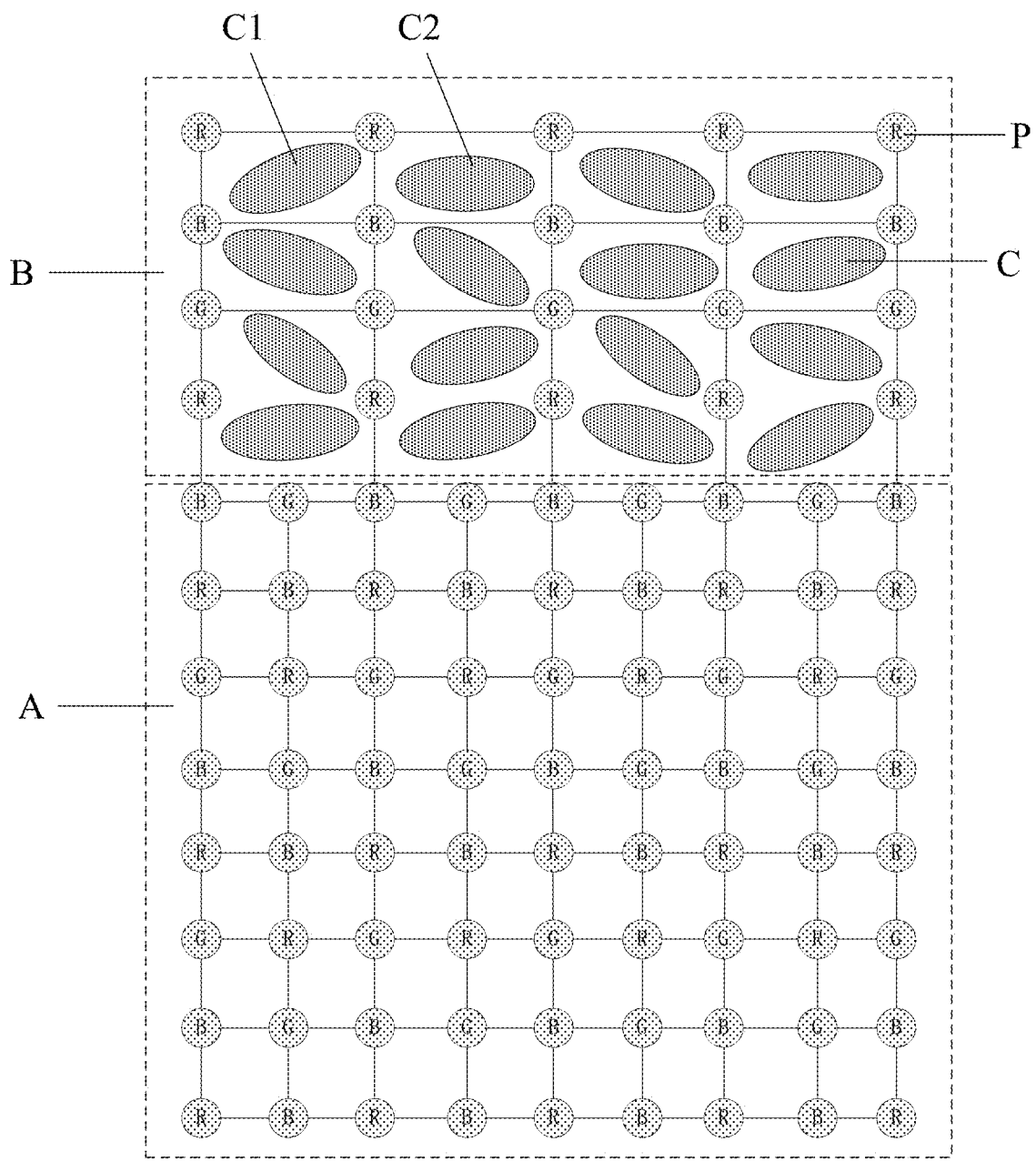
FIG. 5 is a schematic layout of a display area according to various embodiments of the present disclosure.

FIG. 5 shows a schematic layout of a display area of a display panel according to various embodiments of the present disclosure. The display area includes a regular display area A and a transparent display area B. The transparent display area B adjoins the regular display area A and includes multiple transparent areas C and multiple pixels P.

For example, as shown in FIG. 5, shapes of the transparent areas C in the transparent display area B are substantially the same, and for two adjacent transparent areas C, the placement angle of a shape of one transparent area C is different than the placement angle of a shape of the other transparent area C. As such, the transparent areas are not arranged uniformly with the same placement angle, i.e., shapes of the transparent areas in the transparent display area are the same and for two adjacent transparent areas C, the placement angle of a shape of one transparent area C is different than the placement angle of a shape of the other transparent area, which is in contrast to that the transparent areas are arranged evenly, uniformly, and according to a unified direction. Therefore, after the light passes through the transparent areas, the intensity enhancement or reduction in specific areas of the camera due to diffraction and interference may be avoided or reduced. As such, the imaging quality of the camera may be improved. For example, a picture taken by the camera may be clearer.

As shown in FIG. 5, the transparent display area B, as a part of the display area, includes pixels P that may be used to present images in a display process. In addition, the transparent areas C are disposed in the gap regions between the pixels P. The transparent areas C allow external light to pass through the transparent display areas B and be directed to the camera, so that the camera may image after receiving the light.

In FIG. 5, the pixels P are exemplarily represented by circles. The shape of the pixel P is not limited to any pattern. For example, in some embodiments, the pixel P may be other shapes. The letters R, G, and B in the circles each represent a color of a pixel, corresponding to color red, green, and blue, respectively. In FIG. 5, only a limited number of pixels P with a specific layout pattern are illustrated. It is noted that the number of pixels is not limited to a certain value and the pixel layout is not limited to any patterns.

When two transparent areas C in the transparent display area B have the same shape, it may be considered that the two transparent areas can coincide when one of the transparent areas C is scaled by a certain value and moved to a position of the other transparent area C.

In embodiments of the present disclosure, for two adjacent transparent areas, when the placement angle of a shape of one transparent area C is different than the placement angle of a shape of the other transparent area C, it may mean that for two adjacent transparent areas C, one transparent area C can coincide with the other transparent area C through scaling, translation, and rotation, and one transparent area C cannot coincide with the other transparent area C only by scaling and translation.

Figure 6:
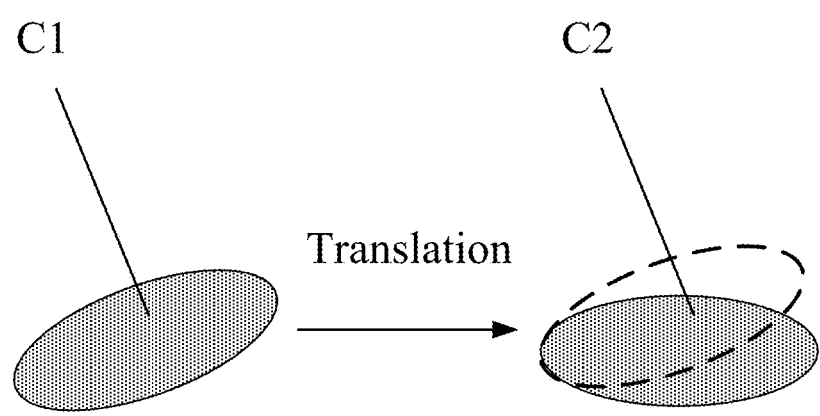
FIG. 6 illustrates a process of judging whether placement angles of two transparent areas are the same according to another exemplary embodiment of the present disclosure.

Take two transparent areas C1 and C2 in FIG. 5 as an example, assuming that the areas of the transparent areas C1 and C2 are the same. Then, a scaling process is no longer needed. FIG. 6 illustrates a schematic process or diagram of judging whether placement angles of the two transparent areas C1 and C2 are the same according to one embodiment of the present disclosure. As shown in FIG. 6, after scaling and translating the transparent area C1 to the location of the transparent area C2, the position of the transparent area C1 is shown as a dashed oval. FIG. 6 shows that the transparent area C1 cannot coincide with the transparent area C2. In addition, if the dashed oval in FIG. 6 is rotated clockwise by a certain angle, it can coincide with the transparent area C2. That is, the transparent area C1 can coincide with the transparent area C2 by scaling, translation, and rotation. However, the transparent area C1 cannot coincide with the transparent area C2 only by scaling and translation. Therefore, the placement angles of the transparent areas C1 and C2 are different.

In some embodiments of the present disclosure, shapes of the transparent areas C in the transparent display area B are the same, and for two adjacent transparent areas, the placement angle of a shape of one transparent area C is different than the placement angle of a shape of the other transparent area C. As such, the transparent areas C in the transparent display area B are disorderly arranged instead of being arranged orderly in a uniform manner. As such, after light passes through the transparent areas C in the transparent display area B, coherent strengthening or weakening is not generated in specific areas. In some embodiment, interference intensity, which is reflected by bright and dark fringes, may be weakened in comparison to that when the transparent areas are arranged orderly in a uniform manner.

In addition, as placement angles of two adjacent transparent areas are different, there are no parallel edges between the opposite sides of the adjacent two transparent areas. In comparison to two adjacent transparent areas where edges of the opposite sides are parallel to each other, coherent strengthening or weakening in specific areas is not generated or interference intensity is reduced. Hence, the camera may receive less superimposed diffracted light, or receive no superimposed diffracted light. In some embodiments, the camera may receive fringes of smaller intensity. As such, the imaging quality of the camera may be improved and an image taken by the camera may be clearer.

In FIG. 5, the transparent area C has an oval shape as an example for illustration. In some other embodiments, the transparent area C may also have other shapes. For example, the transparent area C may be a square or a hexagon as shown below. The transparent area C is not limited to any specific shapes.

Figure 7:
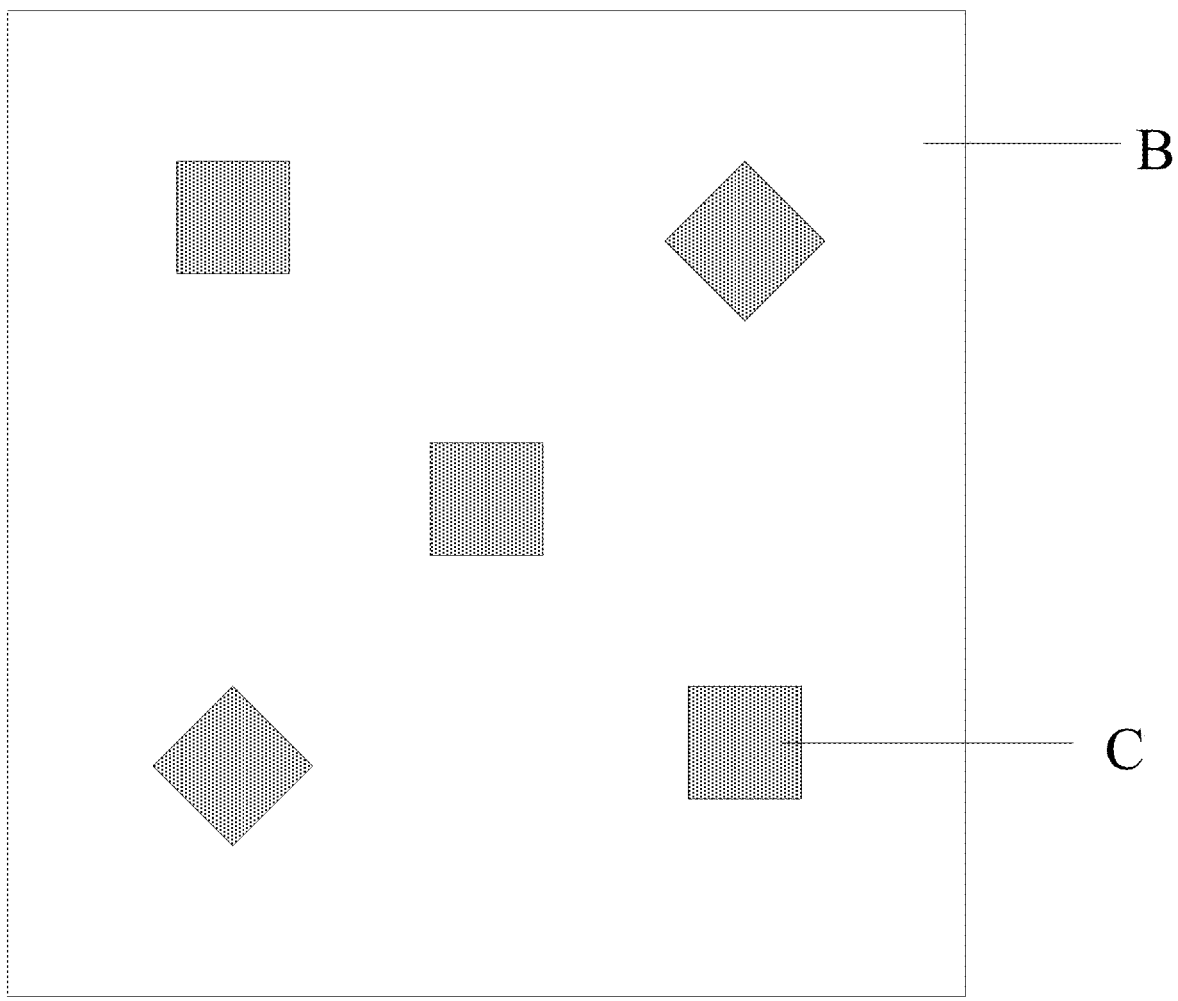
FIG. 7 illustrates a schematic layout of transparent areas in a transparent display area according to another exemplary embodiment of the present disclosure.
Figure 8:
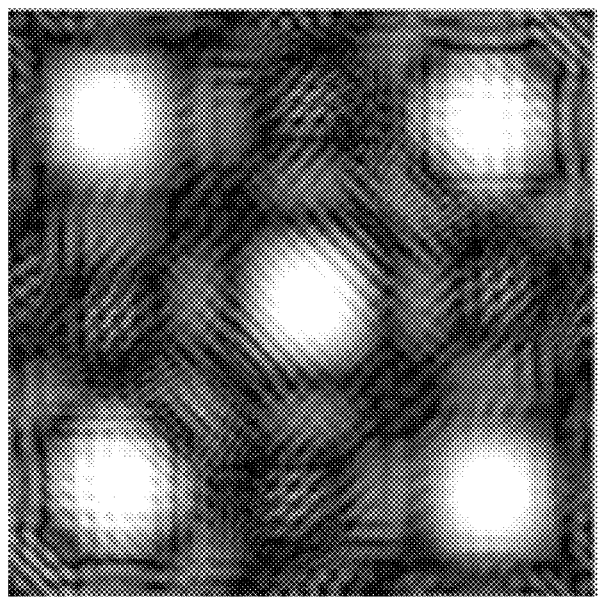
FIG. 8 illustrates a schematic diagram of brightness distribution after light passes through the transparent areas shown in FIG. 7.

FIG. 7 illustrates a schematic layout of transparent areas in a transparent display area according to another exemplary embodiment of the present disclosure. The transparent areas of FIG. 7 and FIG. 1 have the same shape, the same area, and the same layout but the placement angles of the transparent areas are different. FIG. 8 illustrates a schematic diagram of brightness distribution after light passes through the transparent areas shown in FIG. 7. As shown in FIG. 8, in comparison to the brightness distribution diagram shown in FIG. 3, the brightness of the diffraction-enhanced regions around each central region in FIG. 8 is significantly reduced, the area of the diffraction-enhanced region is small and scattered, which can significantly improve the contrast between the central region and the diffraction-enhanced region. As such, for display panels provided by the embodiment of the present disclosure, by setting different placement angles for two adjacent transparent areas, the diffraction fringes formed by the light passing through the display panel may be reduced or bright and dark fringes may be weakened, thereby improving image quality of the camera.

Figure 9:
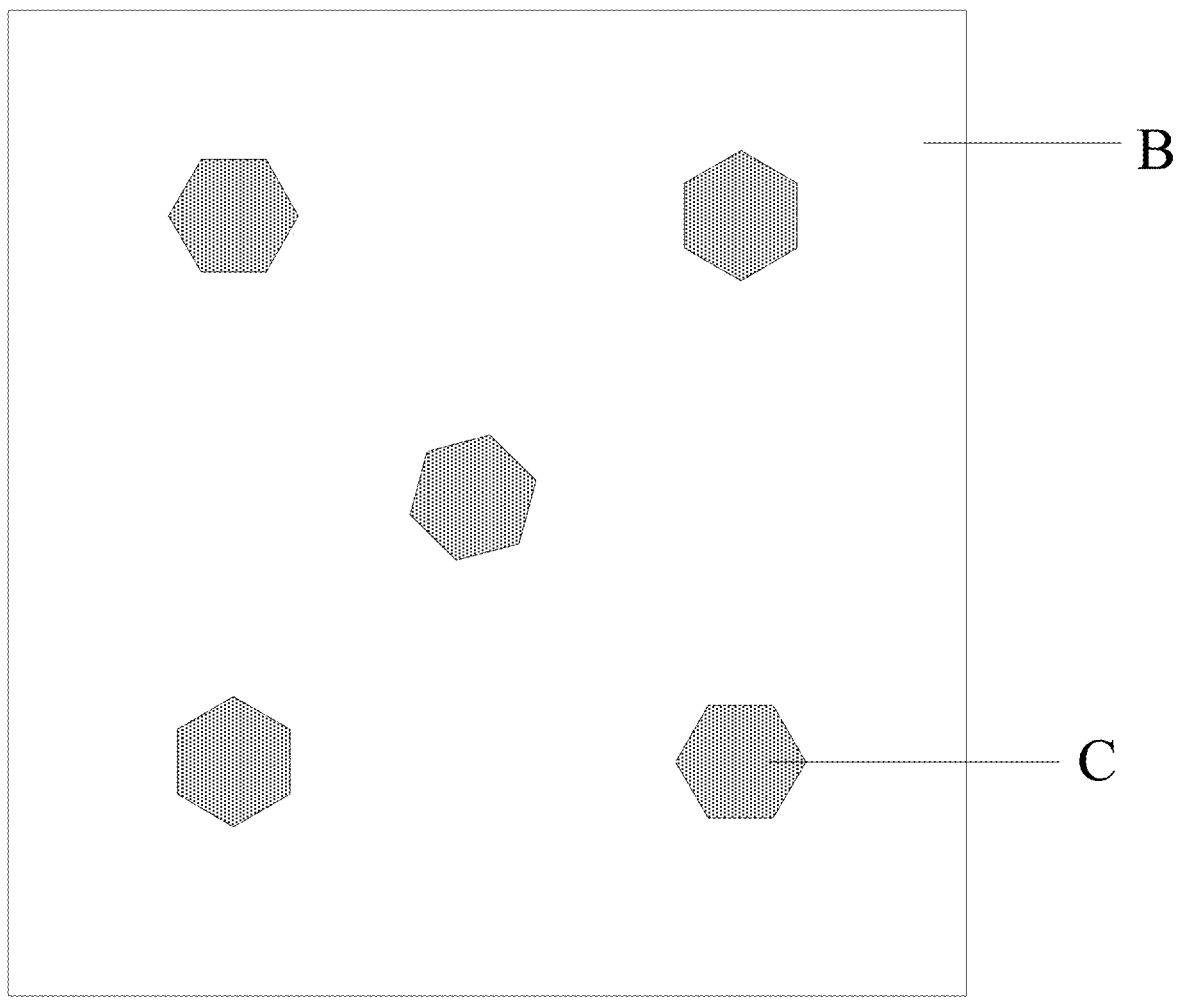
FIGS. 9 and 10 illustrate schematic layouts of transparent areas according to various embodiments of the present disclosure.
Figure 10:
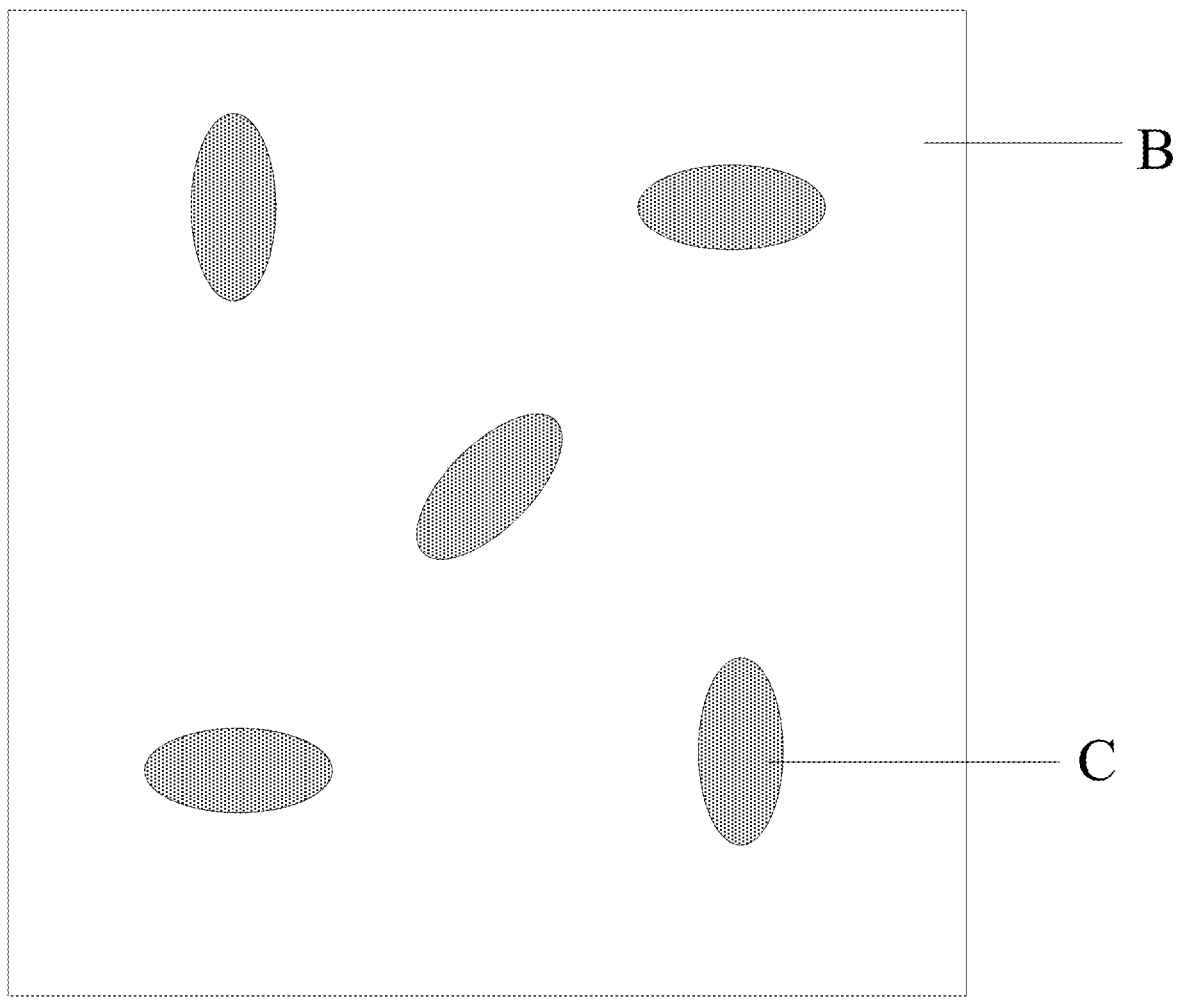

FIGS. 9 and 10 illustrate schematic layouts of transparent areas according to various exemplary embodiments of the present disclosure. As shown in FIGS. 9 and 10, the transparent display area B may be configured so that any two adjacent transparent areas C are set at different placement angles. In some embodiments, the transparent display area B may be configured so that for some transparent areas C, the placement angles of two adjacent transparent areas are different, and for some transparent areas, the placement angles are the same. Hence, placement angles of the transparent areas are not limited to a specific condition and may be arranged differently in some embodiments of the present disclosure.

Figure 11:
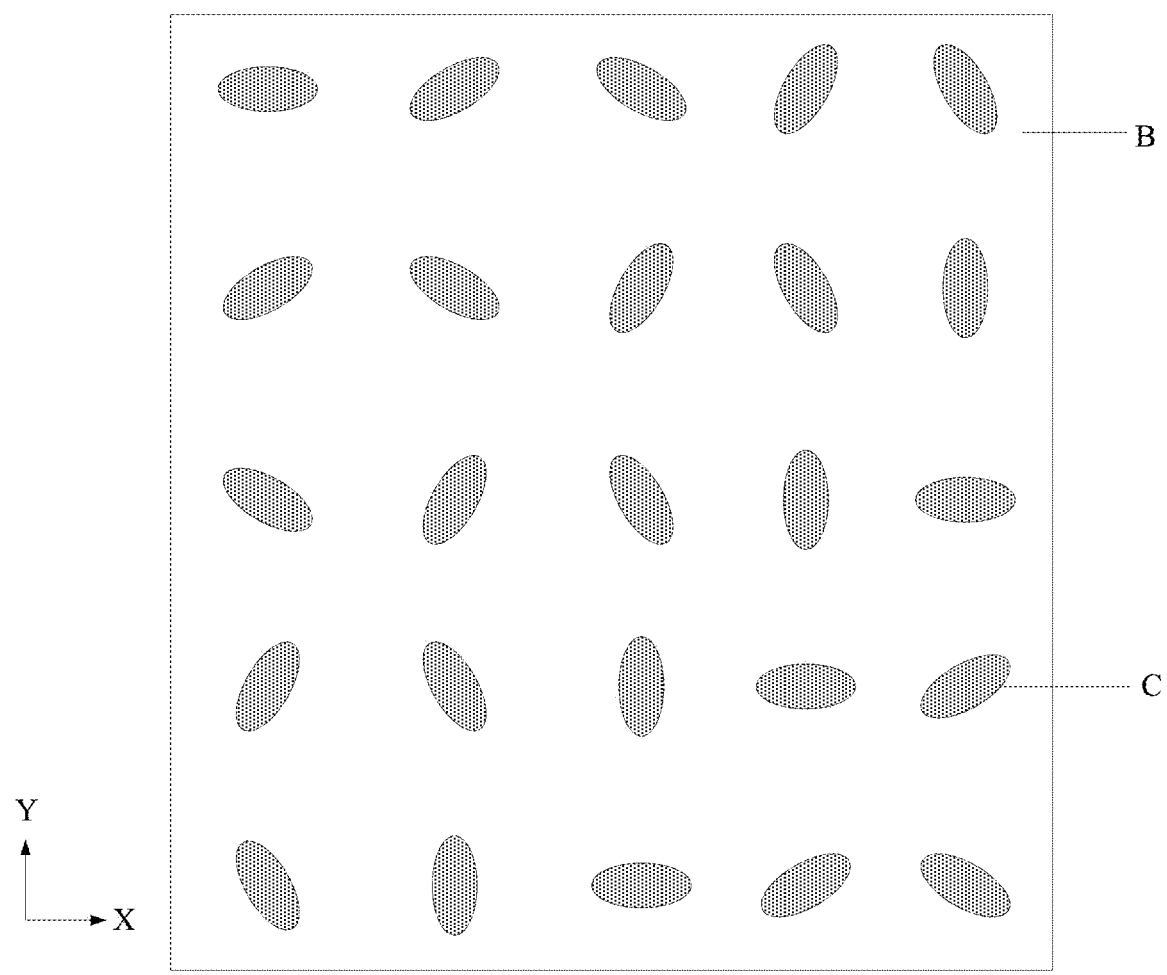
FIGS. 11-17 illustrate schematic layouts of transparent areas in a transparent display area according to various embodiments of the present disclosure.

FIG. 11 illustrates a schematic layout of transparent areas C in a transparent display area B according to another exemplary embodiment of the present disclosure. It is seen that the transparent areas C forms an array.

For two adjacent transparent areas C, the placement angle of a shape of one transparent area C is different than the placement angel of a shape of the other transparent area C in the row direction X or the column direction Y.

Setting transparent areas C in an array arrangement may make the light directed to the camera more evenly distributed and make pixels more evenly arranged in the transparent display area B. As such, the camera may take a clear picture while ensuring that the display panel can display content normally.

In some embodiments, the transparent areas may be configured such that placement angles of shapes of two adjacent transparent areas are different in the row direction only. In some other embodiments, the transparent areas may be configured such that placement angles of shapes of two adjacent transparent areas are different in the column direction only. In some other embodiments, the transparent areas may be configured such that placement angles of shapes of two adjacent transparent areas are different in both the row direction and the column direction. As such, no limitation is made. Hence, the transparent areas C in the transparent display area B may be arranged disorderly, thereby ensuring that less diffracted light is directed towards the camera or that weakened bright and dark fringes are received by the camera and the imaging quality may be improved.

Figure 12:
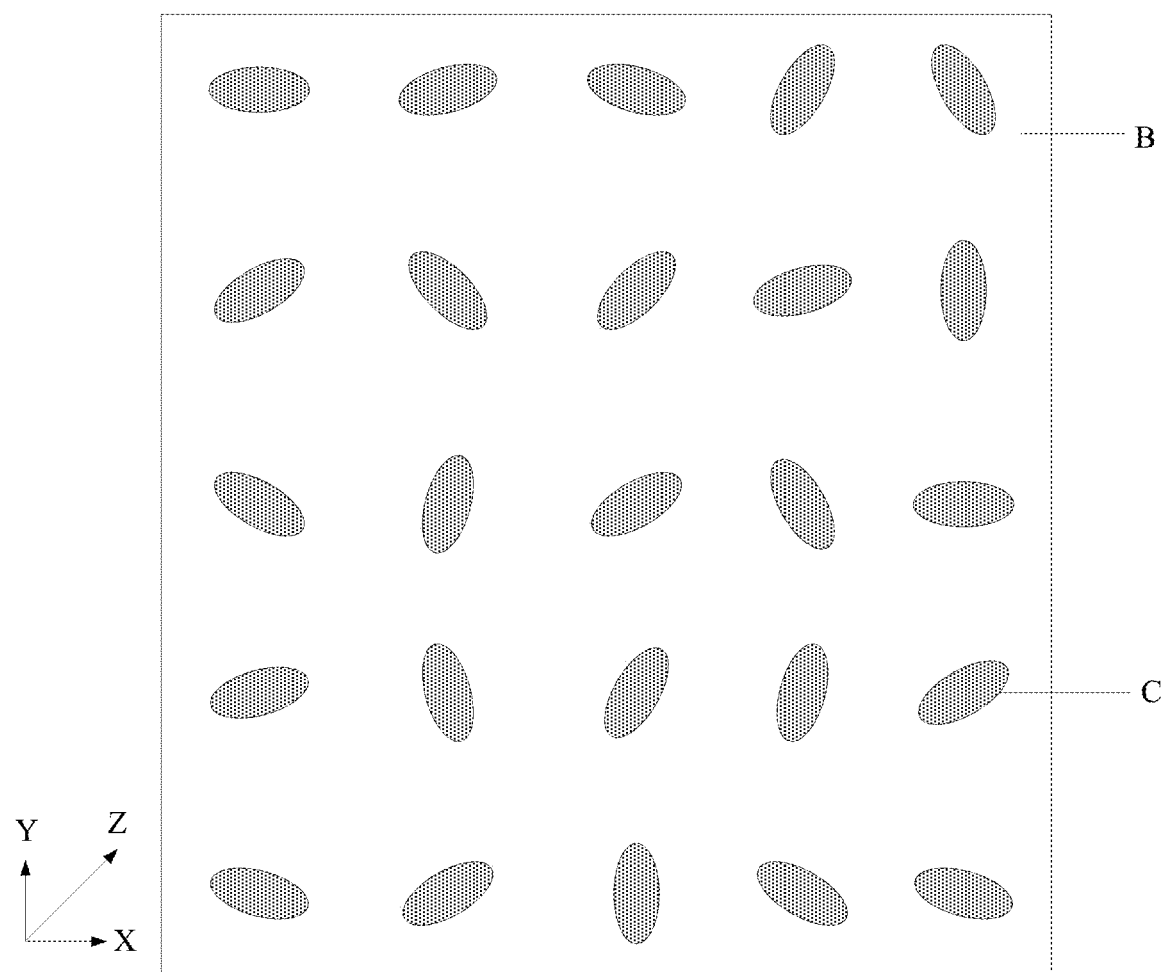

FIG. 12 illustrates a schematic layout of transparent areas C in a transparent display area B according to another exemplary embodiment of the present disclosure. Assuming as an example that a first direction Z is arranged along a diagonal line from the lower left corner to the upper right corner. The first direction Z is different than the row direction X and the column direction Y. As shown in FIG. 12, for two adjacent transparent areas C along the first direction Z, the placement angle of a shape of one transparent area C is different than the placement angle of a shape of the other transparent area C. Along the first direction Z, for each transparent area C, the placement angles of shapes of two adjacent transparent areas are different. As such, the transparent areas C in the transparent display area B are arranged more disorderly, thereby the diffracted light directed to the camera is further reduced and the imaging quality of the camera is further improved.

Figure 13:
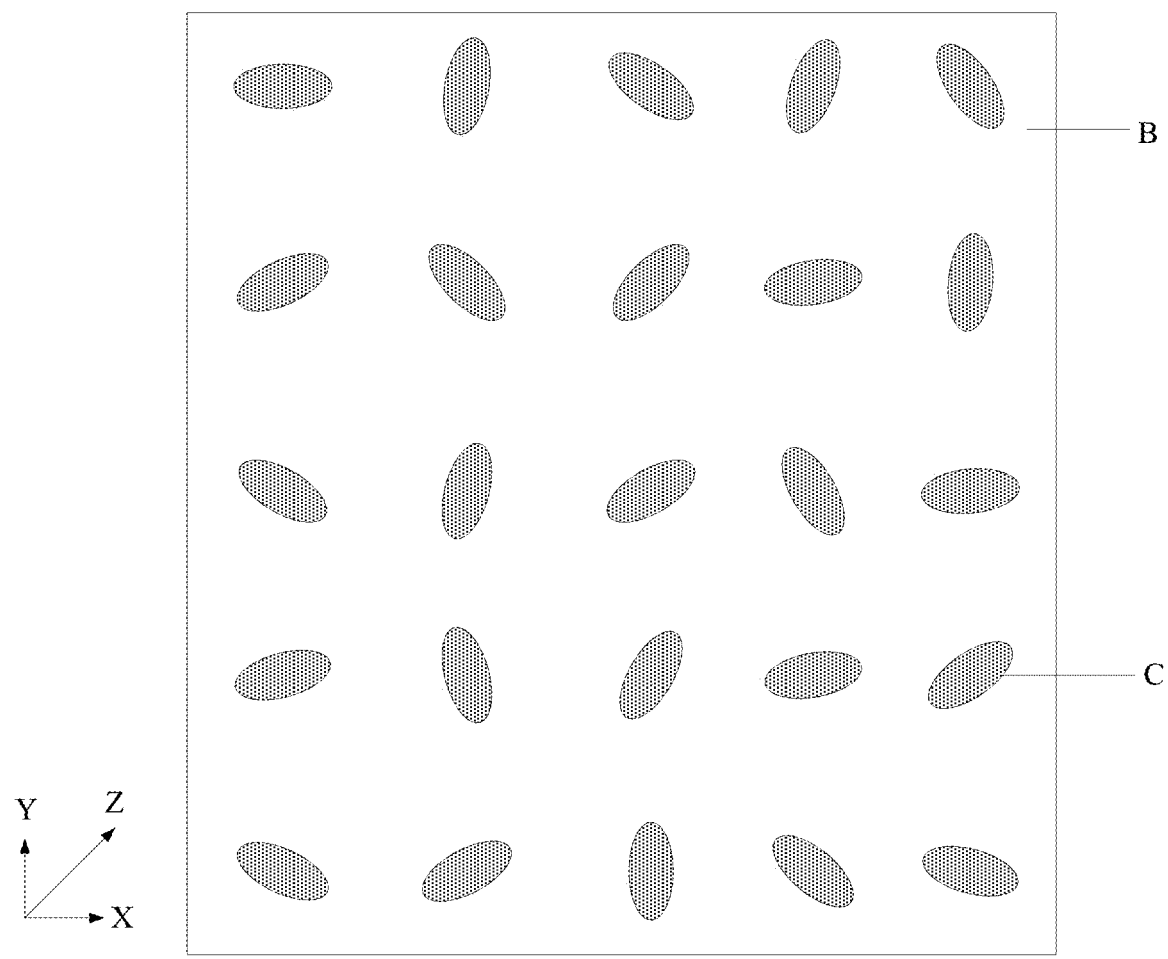

FIG. 13 illustrates a schematic layout of transparent areas C in a transparent display area B according to another exemplary embodiment of the present disclosure. In the transparent display area B, all placement angles of shapes of the transparent areas C are different from each other. As shown in FIG. 13, the displacement angles of shapes of any two transparent areas are different. As such, it is not easy for the light passing through each transparent area C to get diffracted or the intensity maximums of bright and dark fringes may be reduced and the imaging quality of the camera may be improved.

Figure 14:

FIG. 14 illustrates a schematic layout of transparent areas C in a transparent display area B according to another exemplary embodiment of the present disclosure. As shown in FIG. 14, transparent areas C in the same row along the X direction may be divided into multiple repeating units. As shown in FIG. 14, the transparent areas C of the first row may be divided into multiple repeating units M1, and the transparent areas C of the second row may be divided into multiple repeating units M2. The repeating unit may include at least two transparent areas C. Placement angles of shapes of the transparent areas C in a same repeating unit are different from each other. For example, placement angles of shapes of the three transparent areas C in the repeating unit M1 are different from each other, and placement angles of the three transparent areas C in the repeating unit M2 are different from each other. In FIG. 14, each repeating unit in a row has the same number of the transparent areas C. In some other embodiments, repeating unit in different rows may have different numbers of the transparent areas C. The number of transparent areas of a repeating unit in a row is not limited to a specific value.

Figure 15:
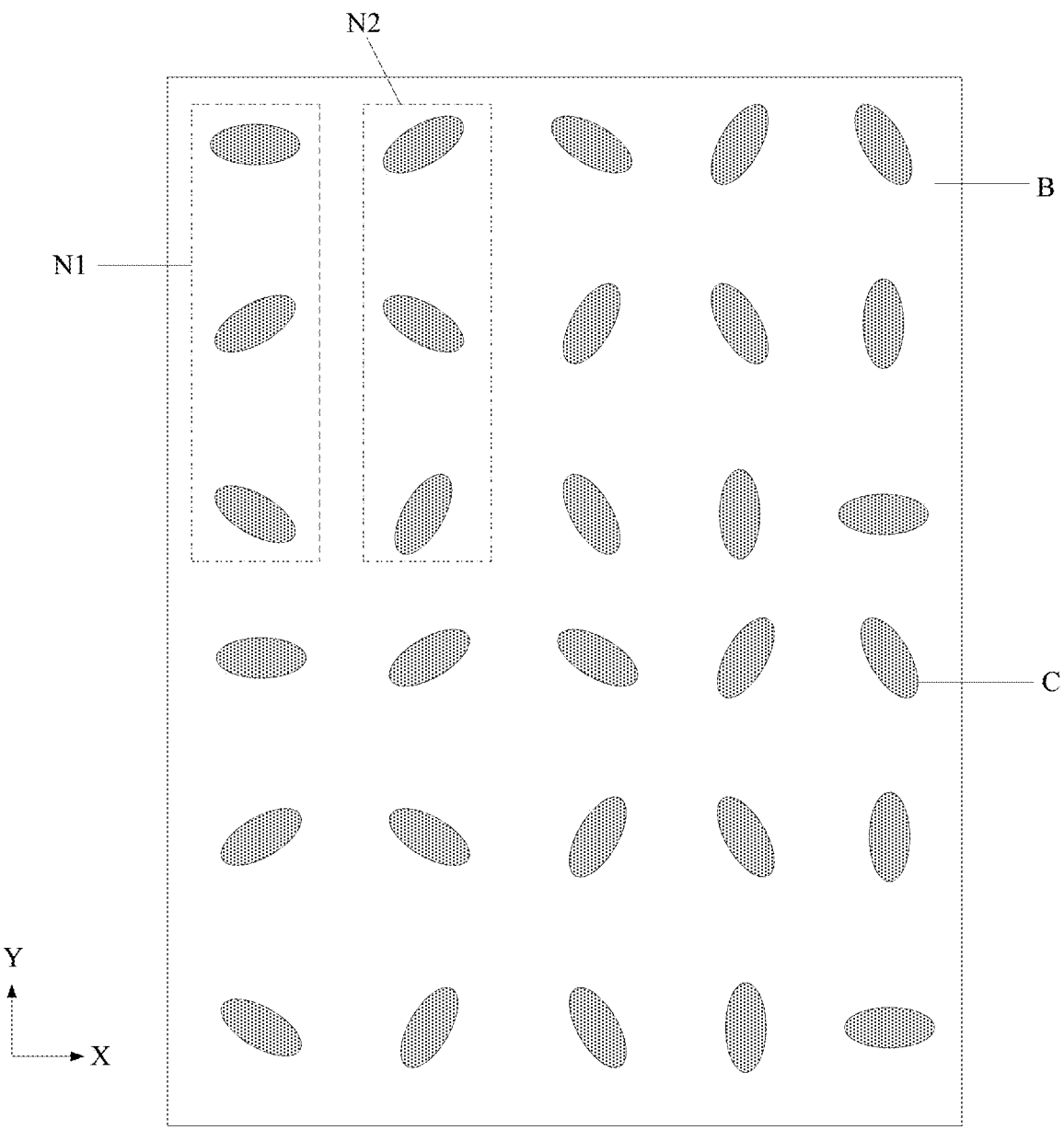

FIG. 15 illustrates a schematic layout of transparent areas C in a transparent display area B according to another exemplary embodiment of the present disclosure. As shown in FIG. 15, transparent areas C in the same column along the Y direction may be divided into multiple repeating units. For example, the transparent areas C of the first column may be divided into multiple repeating units N1, and the transparent areas C of the second column may be divided into multiple repeating units N2. The repeating unit may include at least two transparent areas C. In addition, placement angles of shapes of the transparent areas C in a same repeating unit are different from each other. For example, placement angles of the three transparent areas C in the repeating unit N1 are different from each other, and placement angles of the three transparent areas C in the repeating unit N2 are different from each other. In FIG. 15, each repeating unit in a column has the same number of the transparent areas C. In some other embodiments, repeating unit in different columns may have different numbers of the transparent areas C. The number of transparent areas in a repeating unit in a column is not limited to a specific value.

Figure 16:
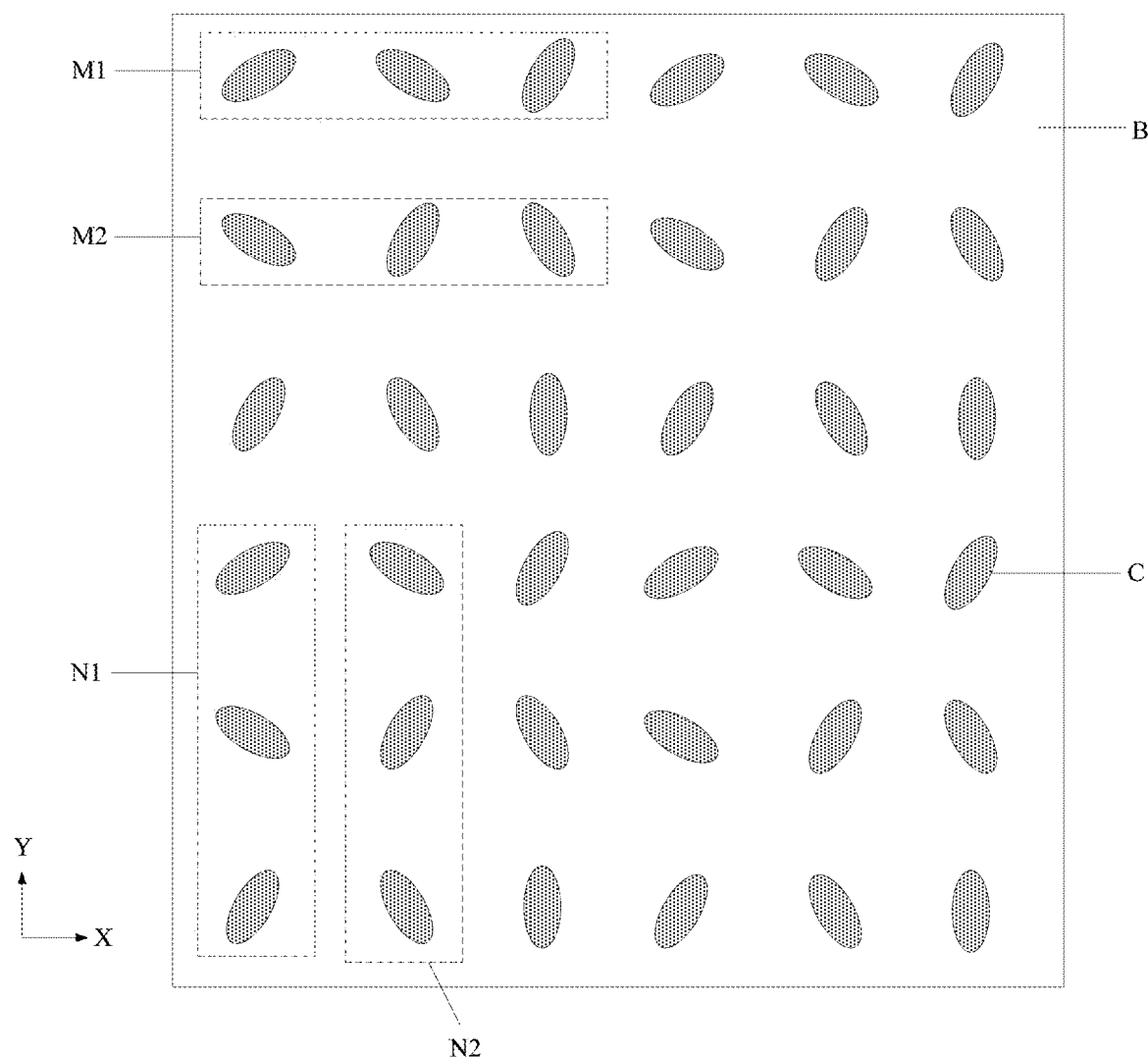

FIG. 16 illustrates a schematic layout of transparent areas C in a transparent display area B according to another exemplary embodiment of the present disclosure. As shown in FIG. 16, transparent areas C in the same row along the X direction may be divided into multiple repeating units. For example, the transparent areas C of the first row may be divided into multiple repeating units M1, and the transparent areas C of the second row may be divided into multiple repeating units M2. Transparent areas C in the same column along the Y direction may be divided into multiple repeating units. Each repeating unit may include at least two transparent areas C. For example, the transparent areas C of the first column may be divided into multiple repeating units N1, and the transparent areas C of the second column may be divided into multiple repeating units N2. Placement angles of shapes pf the transparent areas C in the same repeating unit are different from each other. In FIG. 16, each repeating unit having the same number of the transparent areas C is used as an example. In some other embodiments, repeating unit in different repeating units may have different numbers of the transparent areas C. The number of transparent areas in a repeating unit is not limited to a specific value.

In FIGS. 14-16, each repeating unit includes three transparent areas C. However, the number of transparent areas in a repeating unit is not limited to a certain value.

In some embodiments, each transparent area C may be arranged such that the transparent areas C in a row along the X direction and/or in a column along the Y direction may be divided into multiple repeating units in the transparent display area B. Placement angles of shapes of each transparent area C in the same repeating unit are different from each other. As such, placement angles of multiple adjacent transparent areas C may be different from each other and then the transparent areas C in the transparent display area B may be arranged more disorderly. As such, it is not easy for the light passing through each transparent area C to get diffracted or the intensity maximums of bright and dark fringes may be reduced and the imaging quality of the camera may be improved.

In FIGS. 11-16, oval-shaped transparent areas C are used as examples. It is noted that the transparent areas C may have other shapes. For the transparent area C of other shapes, corresponding configurations may also be made, and no more examples are given here.

In some embodiments, as shown in FIG. 11, the transparent areas C are configured in an array. The geometric centers of the transparent areas C in the same row along the X direction are spaced apart equally or with the same interval, and the geometric centers of the transparent areas C in the same column along the Y direction are spaced apart equally or with the same interval. As such, the light passing through the transparent areas C may be more uniform, and the light intensity received by the camera may be uniform, thereby ensuring a clearer picture. In addition, as the geometric centers of the transparent areas C are equally spaced in the row direction and/or column direction, the pixel in the transparent display area B may be arranged more evenly, which may ensure that the transparent display area may display pictures normally.

In some embodiments, for a display panel, the area of each transparent area C may be the same, so that the total amount of light that passes through each transparent area is approximately the same. Hence, the light intensity received by the camera may be evenly distributed, and the imaging quality of the camera may be further improved.

Figure 17:
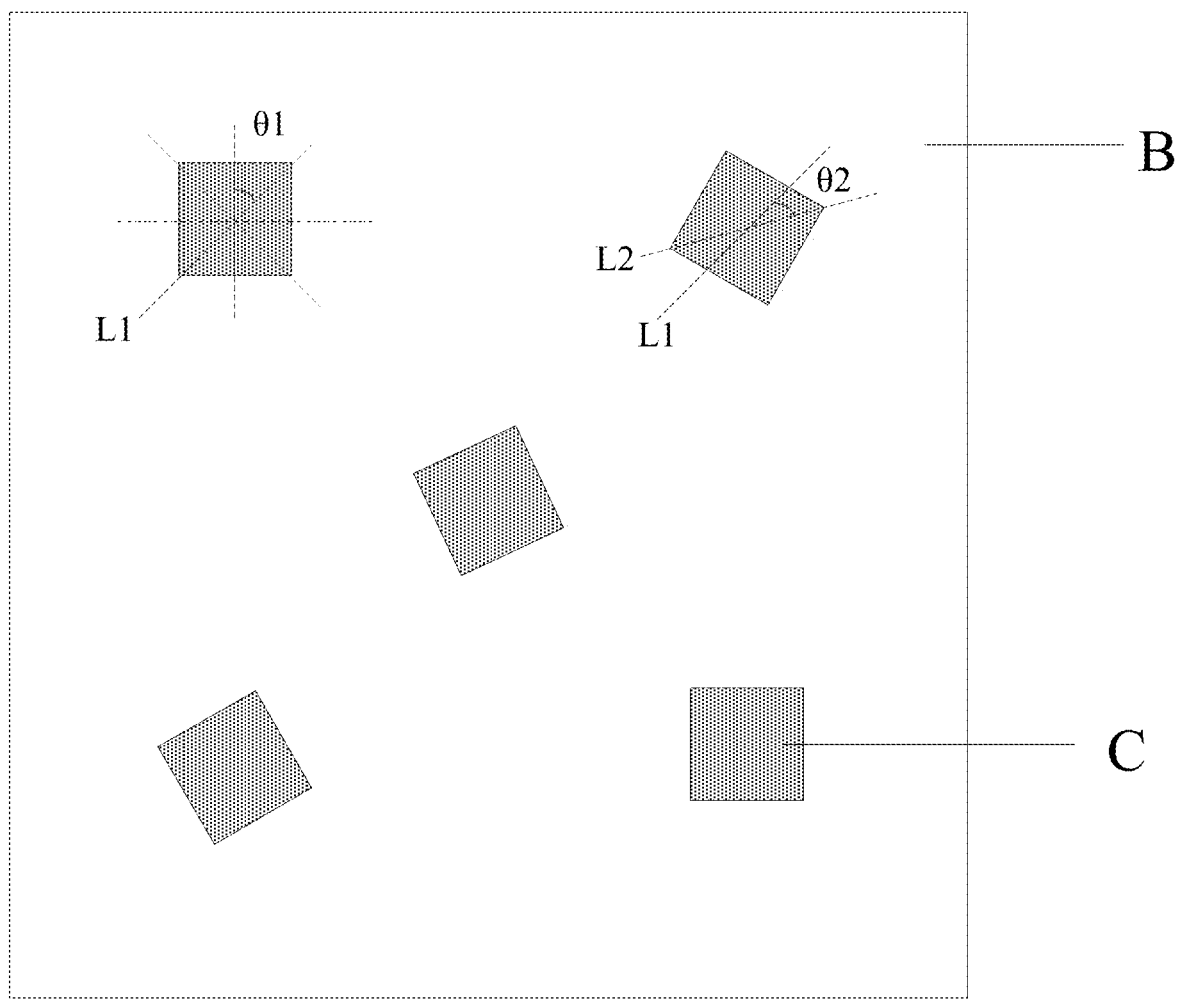

FIG. 17 illustrates a schematic layout of transparent areas C in a transparent display area B according to another exemplary embodiment of the present disclosure. As shown in FIG. 17, the shape of the transparent area C may be axisymmetric with multiple axes of symmetry. For example, the shape of the transparent area C in FIG. 17 may be a square. The first transparent area C in the first row has four axes of symmetry, as shown by the broken lines. For the axes of symmetry of the shape, the smallest angle among angles between any two adjacent axes of symmetry is a first angle, that is, the angle $\theta1$ in FIG. 17.

For two adjacent transparent areas C, such as the two transparent areas C in the first row shown in FIG. 17, the placement angle of one transparent area C after being rotated by a second angle $\theta2$ and the placement angle of the other transparent area C may become the same. The second angle $\theta2$ is arranged smaller than the first angle $\theta1$.

Taking the symmetrical axis L1 of the first transparent area C in the first row as a reference line, and turning the first transparent area C in the first row clockwise by the second angle $\theta2$, the obtained shape and the second transparent area C in the first row have the same placement angle. The second transparent area C of the first row has a corresponding symmetrical axis L2 as a reference line. After L1 is translated to the position of the second transparent area C of the first row, the angle between L1 and L2 is the second angle $\theta2$.

For two adjacent transparent areas C, the placement angle of a shape of one transparent area C after being rotated by a second angle $\theta2$ and the placement angle of a shape of the other transparent area C are the same. Because the second angle $\theta2$ is smaller than the first angle $\theta1$, the placement angle of the transparent area C after being rotated by a second angle $\theta2$ must be different than the original placement angle.

In some embodiments, each transparent area in the transparent display area may be arranged as following. The i+1th transparent area in the row direction, the column direction, or the first direction is obtained through rotating the ith transparent area by the second angle clockwise (or counter-clockwise). The first direction is different from the row direction and column direction.

In some embodiments, the shape of the transparent area may be polygon, for example, the transparent area may be a shape such as a square, a pentagon, a hexagon, etc.

Since the more edges a transparent area has, the less easily the light directed to the edges of the transparent areas may be coherently enhanced or weakened, when a transparent area has more edges, the camera may receive less superimposed diffracted light or the intensity of fringes received by the camera may be reduced, which may be beneficial for improving the imaging quality of the camera.

In some embodiments, edges of transparent areas of above mentioned display panels may include arcs. When edges of transparent areas are arcs, directions of the light directed at different positions on the edge of the transparent area are different, so that it is not easy for the light passing through the transparent area to meet and get coherently enhanced or weakened. As such, diffracted light passing through the transparent areas may be reduced, and the camera may receive less superimposed diffracted light, which may be beneficial for improving the imaging quality of the camera.

In some embodiments, the transparent areas may have an oval shape. As edges of oval transparent areas have no straight lines, directions of the light directed to different positions on the edges of the transparent areas are different. As such, diffracted light passing through transparent areas may be reduced, and the camera may receive less superimposed diffracted light further, which may be beneficial for improving the imaging quality of the camera.

Figure 18:
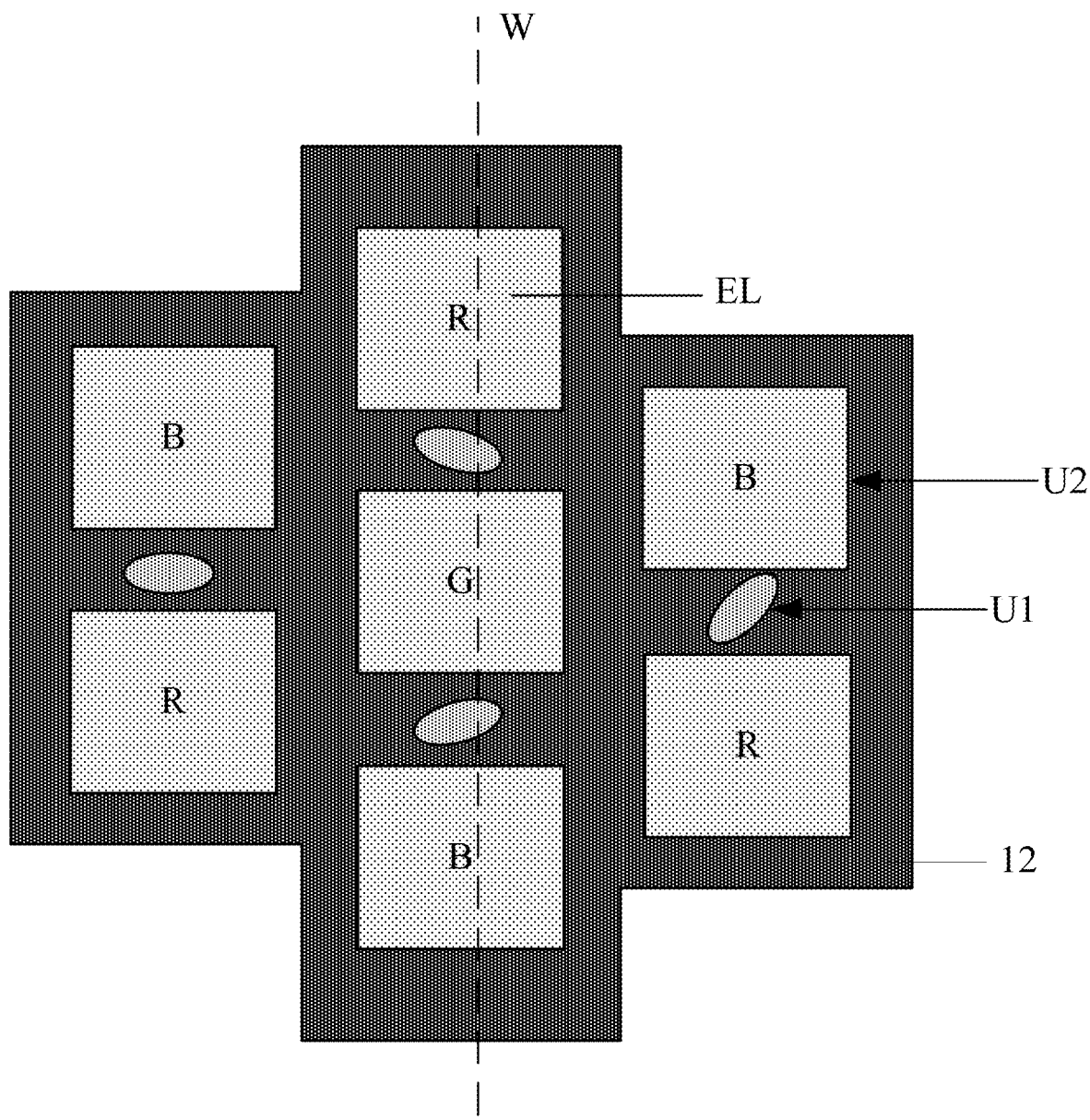
FIG. 18 illustrates a schematic top view of a display area when viewed from a light shielding layer toward a substrate according to one exemplary embodiment of the present disclosure.
Figure 19:
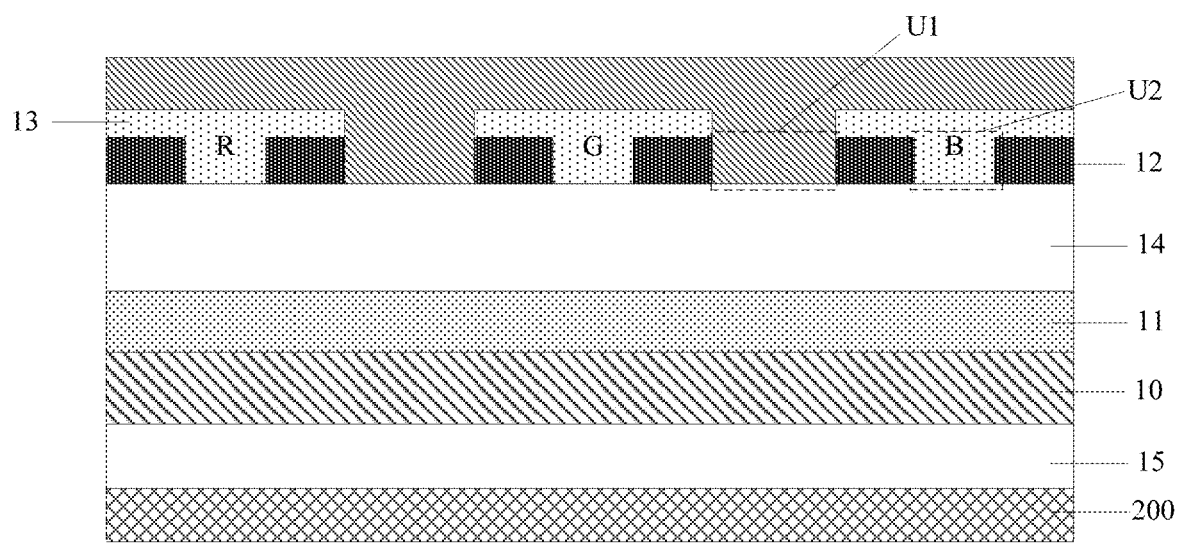
FIG. 19 illustrates a schematic cross-sectional view along a dashed line W in FIG. 18.

FIG. 18 illustrates a schematic top view of a display area of a display panel when viewed from a light shielding layer toward a substrate according to one exemplary embodiment of the present disclosure. FIG. 19 illustrates a schematic cross-sectional view along a dashed line W in FIG. 18. As shown in FIG. 19, the display panel may include a substrate 10 and a light emitting functional layer 11 that is on the side of the substrate 10. The light emitting functional layer 11 may include multiple light emitting elements EL (not shown in FIGS. 18 and 19) including a light emitting element that emits red (R) light, a light emitting element that emits green (G) light, and a light emitting element that emits blue (B) light.

The display panel may further include a light shielding layer 12 that is disposed on a side of the light emitting functional layer 11 and farther away from the substrate 10 than the light emitting functional layer 11. The light shielding layer 12 may include multiple first openings U1 and multiple second openings U2. The first openings U1 may be disposed in the transparent areas, and the second openings U2 may expose the light emitting elements EL.

As shown in FIG. 18, the second openings U2 in the light shielding layer 12 may expose the light emitting elements EL, so that pixels corresponding to the positions may emit light of corresponding colors, respectively. The first opening U1 in the light shielding layer 12 may be disposed between adjacent second openings U2, and the first opening U1 may define the shape of the transparent areas. For example in FIG. 18, by setting the first opening U1 to be an oval shape, the shape of a corresponding transparent area is an oval.

Figure 20:
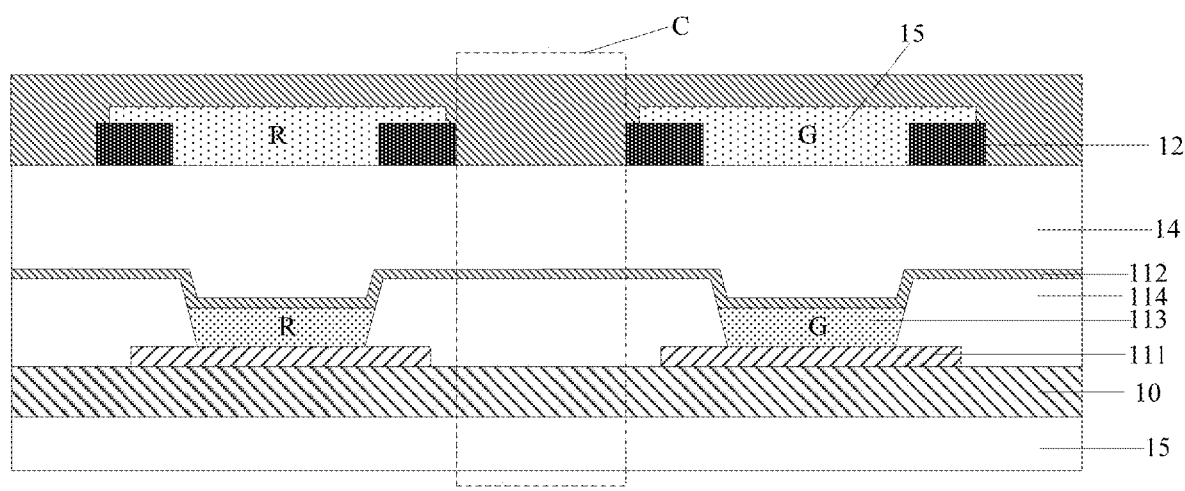
FIG. 20 illustrates a schematic cross-sectional view of a display panel according to another exemplary embodiment of the present disclosure.

FIG. 20 illustrates a schematic cross-sectional view of a display panel according to another exemplary embodiment of the present disclosure. In FIG. 20, the light emitting elements are organic light-emitting diodes (LEDs). Two adjacent red and green LEDs are used as an example for illustration in FIG. 20. The organic LED may include a first electrode 111, a second electrode 112, and a light emitting layer 113 disposed between the first electrode 111 and the second electrode 112. The first electrode 111 may be disposed between the second electrode 112 and the substrate 10.

It is configured that the first electrode 111 does not overlap the transparent area C. The first electrode 111 is arranged not overlapping the transparent area C. As such, the light that enters inside the display panel does not impinge on the edges of the first electrode 111 after passing through the transparent areas C. As a result, the diffracted light received by the camera may be further reduced, which may be beneficial for improving the imaging quality of the camera.

In some embodiments, the light emitting layer 113 may include a red (R) light emitting unit, a green (G) light emitting unit, and a blue (B) light emitting unit. The position of each light emitting unit may be defined by a pixel defining layer 114.

In some embodiments, for display panels as illustrated exemplarily in FIG. 5, the regular display area A may include multiple pixels P, and the pixel density in the regular display area A is greater than that in the transparent display area B.

As a camera needs to receive sufficient light to shoot a picture, pixel density in the transparent display area B may be configured relatively thin. That is, the pixel density in the transparent display area B may be smaller than the pixel density in the regular display area A. However, if the brightness of a single pixel in the transparent display area B and the brightness of a single pixel in the regular display area A are the same, there may be a brightness difference between the transparent display area B and the regular display area A. Bright lines or split screens may appear at the junction of the two areas, resulting in poor display effects. Therefore, the brightness of pixels in the transparent display area B needs to be set higher than the brightness of pixels in the regular display area A.

Figure 21:
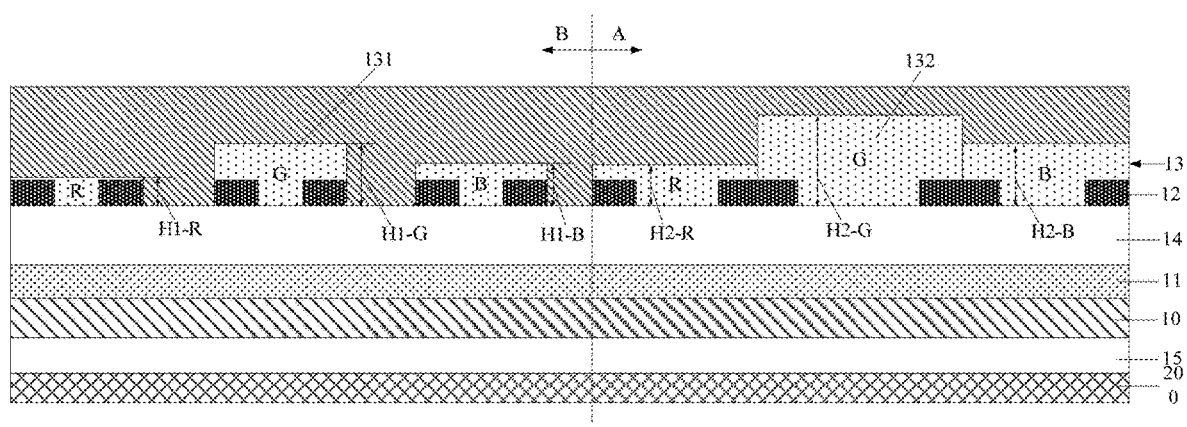
FIG. 21 illustrates a schematic cross-sectional view of a display panel according to another exemplary embodiment of the present disclosure.

FIG. 21 illustrates a schematic cross-sectional view of a display panel according to another exemplary embodiment of the present disclosure. The left side of the dashed line in FIG. 21 shows a schematic cross-sectional view in the transparent display area, and the right side of the dashed line shows a cross-sectional schematic view in the regular display area. The display panel may include a substrate 10, a light emitting functional layer 11 disposed on a side of the substrate 10, and a color film layer 13 disposed on a side of the light emitting functional layer 11 and farther away from the substrate 10 than the light emitting functional layer 11. The color film layer 13 may include multiple color film units. The multiple color film units have at least three colors.

In FIG. 21, the multiple color film units include a red (R) color film unit, a green (G) color film unit, and a blue (B) color film unit, which are employed as examples. Color film units are used to filter the light emitted by pixels. The color film units may include a first color film unit 131 and a second color film unit 132. The first color film unit 131 is disposed in the transparent display area B, and the second color film unit 132 is disposed in the regular display area A.

For color film units with the same color, the thickness of the second color film unit 132 is greater than the thickness of the first color film unit 131. As shown in FIG. 21, the thickness H1-R of the first red color film unit 131 is smaller than the thickness H2-R of the second red color film unit 132, the thickness H1-G of the first green color film unit 131 is smaller than the thickness H2-G of the second green color film unit 132, and the thickness H1-B of the first blue color film unit 131 is smaller than the thickness H2-B of the second blue color film unit 132.

For a pixel, the brightness of the pixel is proportional to the electric current density, while the electric current density is inversely proportional to the lifetime of the pixel. That is, lifetime of pixels in the transparent display area B may be shorter than lifetime of pixels in the regular display area A. The shorter a pixel's lifetime, the faster the pixel's brightness decays. In addition, since light emitting materials of different colors have different lifetime values, due to the increased electric current density in the transparent display area B, the difference of brightness decay between pixels of different colors may be increased. The larger the difference of brightness decay between pixels of different colors, the more severe the color shift phenomenon of the display panel. As such, compensation may be implemented in regard to brightness decay of different colors in the transparent display area. For example, by setting the thickness of the first color film unit 131 smaller than the thickness of the second color film unit 132, the light transmittance of the transparent display area B may be increased, which may reduce the brightness difference between the transparent display area and the regular display area, and balance the impact of pixel lifetime of different colors on the display panel.

In some embodiments, for display panels as above mentioned and as shown in FIG. 19, the color film units and the transparent areas C do not overlap. As the color film units and the transparent areas C are arranged not overlapping, the light that enters inside the display panel does not impinge on the edges of the color film units, which prevents the light from being directed to the edge of the color film unit to form divergent diffracted light. As such, the diffracted light received by the camera may be further reduced, which may be beneficial for improving the imaging quality of the camera. In addition, it may prevent the light from going through the color film units to change the color of the light and causing a color shift phenomenon in a picture taken by the camera.

Further, other opaque layers of the display panel may be configured to have no structure in the transparent areas. For example, metal layers used to form circuit structures may be formed outside the transparent areas.

In some embodiments, as shown in FIG. 19, the display panel may further include an encapsulation layer 14 disposed between the organic light emitting functional layer 11 and the light shielding layer 12. The encapsulation layer 14 is used for encapsulating the organic light emitting functional layer 11 to prevent water vapor and oxygen gas from entering the display panel, damaging to the organic light emitting functional layer 11, and affecting the display effect.

Further, at a position corresponding to the transparent display area, the camera 200 may be attached to the back of the display panel through an adhesive layer 15. For example, the adhesive layer 15 may contain polyimide (PI) material or other materials, which is not limited here.

In some embodiments, the camera 200 may be replaced with a fingerprint recognition sensor, so as to achieve fingerprint recognition under the screen. Alternatively, the camera 200 may also be replaced with another photosensitive component, which is not limited here.

Figure 22:
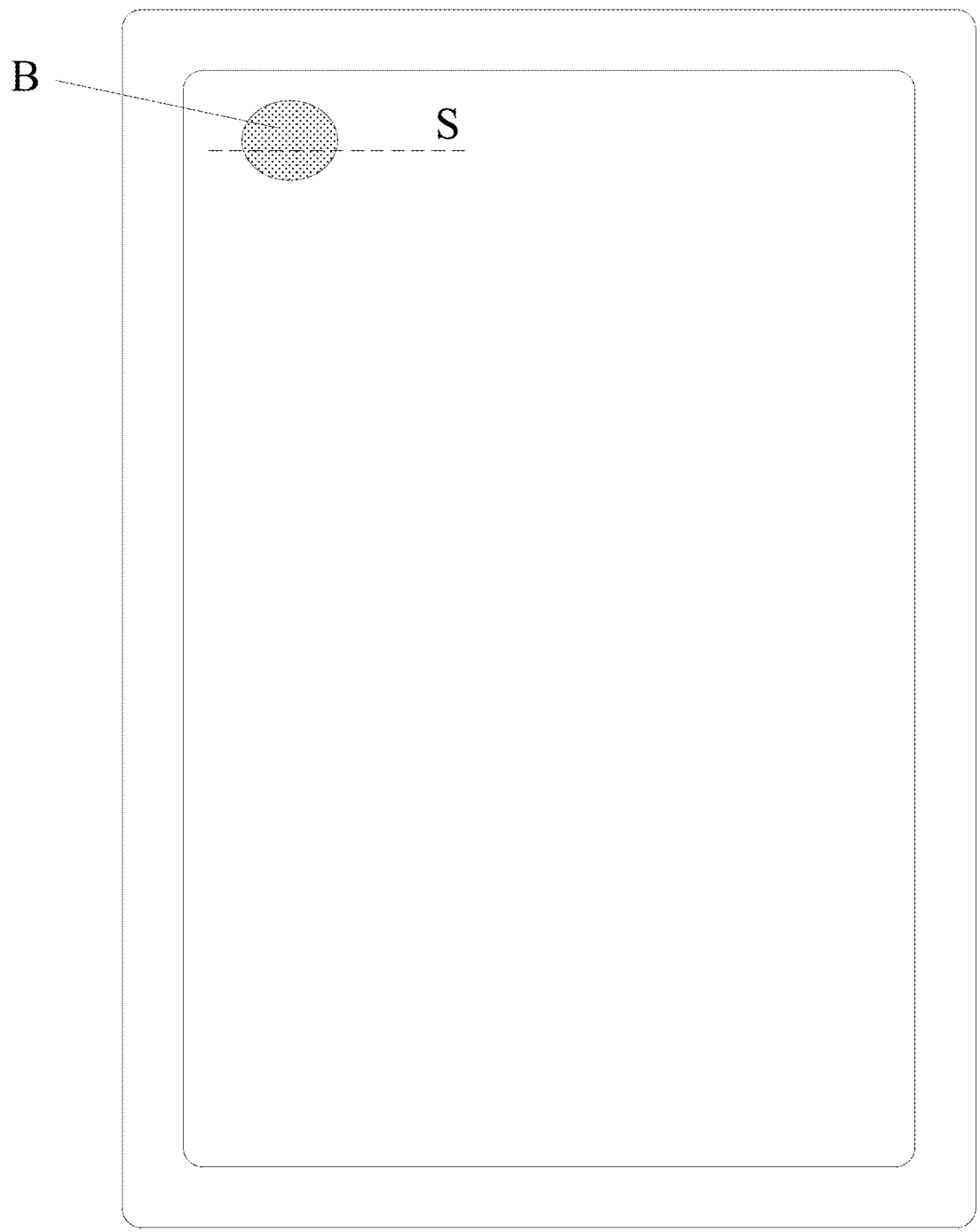
FIG. 22 illustrates a schematic top view of a display device according to another exemplary embodiment of the present disclosure.
Figure 23:
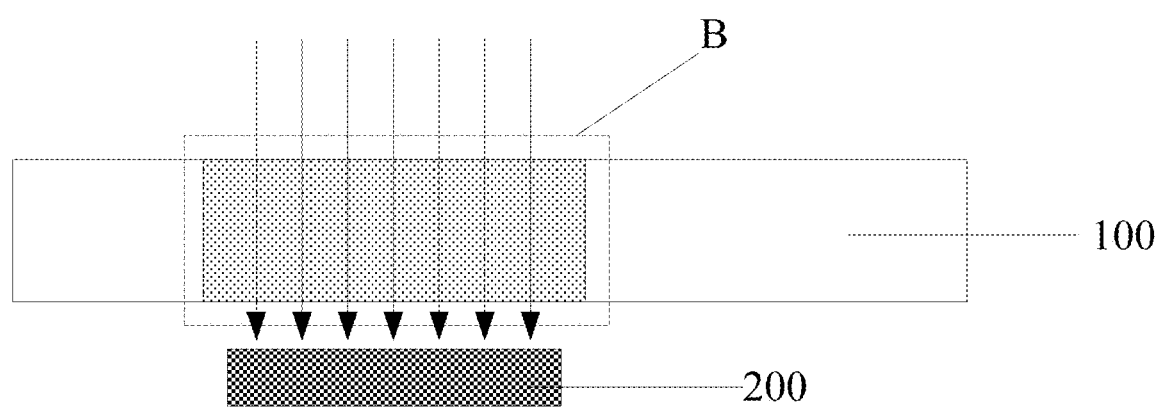
FIG. 23 illustrates a schematic cross-sectional view along a dashed line S in FIG. 22.

Some embodiments of the present invention further provide a display device including one of the above mentioned display panels. The display device may be applied to any product or device having a display function, such as a mobile phone. FIG. 22 illustrates a schematic top view of a display device according to another exemplary embodiment of the present disclosure, and FIG. 23 illustrates a schematic cross-sectional view along a dashed line S in FIG. 22. As shown in FIG. 22, the display device may be applied to a mobile phone. The display panel of the mobile phone may employ a display panel provided by embodiments of the present disclosure. Additionally, the display device may also be applied to a tablet computer, a television, a monitor, a notebook computer, a digital photo frame, a navigator, and other products or devices, As shown in FIGS. 22 and 23, the display device may include a display panel 100 and a camera 200 disposed in a transparent display area B. For example, the camera 200 may be disposed on the back of the display panel 100 corresponding to the transparent display area B. During a shooting period of the camera, light may pass through the transparent display area B, and the camera 200 may capture a corresponding picture via the light that passes through the transparent display area B of the display panel 100.

In some embodiments, the camera 200 may be replaced with a fingerprint recognition sensor, which may enable fingerprint recognition under the screen. In some other embodiments, two transparent display areas may be arranged on the display panel 100, where a camera may be disposed in one transparent display area and a fingerprint recognition sensor may be disposed in the other transparent display area, which is not limited.

In the display panel and the display device provided by embodiments of the present disclosure, each transparent area in the transparent display area has the same shape. For two adjacent transparent areas, the placement angle of a shape of one transparent area is different than the displacement angle of a shape of the other transparent area. As such, the rule that the transparent areas are arranged evenly, uniformly, and according to a unified direction is broken. Therefore, after the light passes through the transparent areas, the phenomenon that the light is strengthened or weakened in specific areas of the camera due to interference and diffraction may be avoided. Imaging quality of the camera may be improved, and pictures taken by the camera may be clear.

In some other embodiments, transparent areas in the transparent display area may have different shapes. For two adjacent transparent areas, the shapes may be different. For example, two adjacent transparent areas may have a circular and an oval shape. In some embodiments, the different shapes may have the same area. In some other embodiments, the different shapes may have different areas. In some embodiments, the area of a shape may be determined by the light it transmits. For example, the area of a shape may be arranged such that the light that passes thought has a certain power. Arrangement of different shapes may be similar to the arrangement of different placement angles discussed above. Exemplary shapes may include a circle, an oval, a polygon including a square, a pentagon, etc., and/or an irregular shape. In addition, different shapes may also include some shapes that belong to the same shape type but are different. For example, different shapes may include two ovals that have different lengths of minor and/or major axes. In some embodiments, adjacent transparent areas may have different shapes with the same placement angle. In some other embodiments, adjacent transparent areas may have different shapes with different placement angles. Further in some other embodiments, some adjacent transparent areas may have different shapes with the same placement angle and some other adjacent transparent areas may have different shapes with different placement angles. Accordingly, the transparent areas are arranged disorderly when adjacent transparent areas have different shapes with the same or different placement angles. Similarly, bright and dark fringes received by the camera may be weakened and imaging quality of the camera may be improved.

Further, it should be noted that the above embodiments are used only to illustrate the technical solutions of the present disclosure and not to limit it to the present disclosure. Although the present disclosure is described in detail in the light of the foregoing embodiments, those of ordinary skill in the art should understand that they can still modify the technical solutions recorded in the preceding embodiments, or they can perform equivalent replacements for some or all of the technical features. The modifications or substitutions, however, do not make the nature of the corresponding technical solutions out of the scope of the technical solutions of each embodiment of the present disclosure.

What is claimed is:

1. A display panel, comprising:
a display region, comprising a regular display region, and a transparent display region connected to the regular display region, the transparent display region comprising:
a plurality of transparent areas; and
a plurality of pixels, wherein the plurality of transparent areas has a same shape, and for two adjacent transparent areas of the plurality of transparent areas, a shape of one transparent area has a different placement angle than a shape of another transparent area.

2. The display panel according to claim 1, wherein:
the plurality of transparent areas are arranged in an array, and
along a row direction or a column direction of the array, the shape of the one transparent area of the two adjacent transparent areas has the different placement angle than the shape of the another transparent area of the two adjacent transparent areas.

3. The display panel according to claim 2, wherein:
a first direction is different from the row direction and the column direction, and
along the first direction, the shape of the one transparent area of the two adjacent transparent areas has the different placement angle than the shape of the another transparent area of the two adjacent transparent areas.

4. The display panel according to claim 2, wherein:
placement angles of shapes of all of the plurality of transparent areas are different from each other in the transparent display region.

5. The display panel according to claim 2, wherein:
transparent areas in a same row of the array are divided into a plurality of row repeating units, each row repeating unit including at least two transparent areas, and shapes of all of transparent areas that belong to a same row repeating unit having different placement angles; and/or
transparent areas in a same column of the array are divided into a plurality of column repeating units, each column repeating unit including at least two transparent areas, and shapes of all of transparent areas that belong to a same column repeating unit having different placement angles.

6. The display panel according to claim 1, wherein the plurality of transparent areas are arranged in an array, and
geometric centers of transparent areas in a same row of the array are equally spaced apart; and/or
geometric centers of transparent areas in a same column of the array are equally spaced apart.

7. The display panel according to claim 1, wherein:
each of the plurality of transparent areas has a same area.

8. The display panel according to claim 1, wherein:
the plurality of transparent areas each has an axisymmetric shape and has a plurality of axes, a smallest angle among angles between any two adjacent axes of the plurality of axes is a first angle, and
for the two adjacent transparent areas of the plurality of transparent areas, a placement angle of the shape of the one transparent area of the two adjacent transparent areas is rotated by a second angle to coincide with a placement angle of the shape of the another transparent area, the second angle being smaller than the first angle.

9. The display panel according to claim 8, wherein the axisymmetric shape includes a polygon shape.

10. The display panel according to claim 8, wherein an edge of the axisymmetric shape includes an arc.

11. The display panel according to claim 10, wherein the axisymmetric shape includes an oval shape.

12. The display panel according to claim 1, further comprising:
a substrate;
a light emitting functional layer on a side of the substrate; and
a light shielding layer on a side of the light emitting layer away from the substrate, wherein the light emitting functional layer includes a plurality of light emitting elements, and the light shielding layer includes a plurality of first openings in the plurality of transparent areas and a plurality of second openings that exposes the plurality of light emitting elements.

13. The display panel according to claim 12, wherein:
the plurality of light emitting elements includes an organic light-emitting diode,
the organic light-emitting diode includes a first electrode, a second electrode, and a light emitting layer disposed between the first electrode and the second electrode,
the first electrode is disposed between the second electrode and the substrate, and
the first electrode does not overlap the plurality of transparent areas.

14. The display panel according to claim 1, wherein:
the regular display region comprises a plurality of pixels, a pixel density in the regular display region being larger than a pixel density in the transparent display region.

15. The display panel according to claim 14, further comprising:
a substrate;
a light emitting functional layer on a side of the substrate; and
a color film layer on a side of the light emitting functional layer, away from the substrate, wherein the color film layer comprises a plurality of color film units, the plurality of color film units at least including three colors for filtering light emitted by the plurality of pixels, a color film unit of the plurality of color film units comprising:
a first color film unit disposed in the transparent display region; and
a second color film unit disposed in the regular display region, wherein a thickness of the second color film unit is greater than a thickness of the first color film unit for a same color.

16. The display panel according to claim 15, wherein:
the plurality of color film units does not overlap the plurality of transparent areas.

17. A display device, comprising:
a display panel comprising a display region, the display region comprising:
a regular display region; and
a transparent display region connected to the regular display region, the transparent display region comprising:
a plurality of transparent areas; and
a plurality of pixels, wherein the plurality of transparent areas has a same shape, and for two adjacent transparent areas of the plurality of transparent areas, a shape of one transparent area has a different placement angle than a shape of another transparent area.

18. The display device according to claim 17, further comprising:
a camera disposed in the transparent display region.

* * * * *